(12) United States Patent
Platzgummer et al.

(10) Patent No.: US 8,258,488 B2
(45) Date of Patent: Sep. 4, 2012

(54) COMPENSATION OF DOSE INHOMOGENEITY AND IMAGE DISTORTION

(75) Inventors: Elmar Platzgummer, Vienna (AT); Heinrich Fragner, Vienna (AT); Stefan Cernusca, Innermanzing (AT)

(73) Assignee: IMS Nanofabrication AG, Vienna (AT)

( * ) Notice: Subject to any disclaimer, the term of this patent is extended or adjusted under 35 U.S.C. 154(b) by 81 days.

(21) Appl. No.: 12/535,744

(22) Filed: Aug. 5, 2009

(65) Prior Publication Data

US 2010/0038554 A1 Feb. 18, 2010

(30) Foreign Application Priority Data

Aug. 7, 2008 (EP) .................................... 08450121

(51) Int. Cl.
*A61N 5/00* (2006.01)
(52) U.S. Cl. .................................................. 250/492.1
(58) Field of Classification Search ............. 250/492.11, 250/492.1, 492.2, 492.21, 492.22, 492.23, 250/492.24, 492.3
See application file for complete search history.

(56) References Cited

U.S. PATENT DOCUMENTS

| | | | | |
|---|---|---|---|---|
| 5,352,899 A | * | 10/1994 | Golovanivsky et al. | 250/492.21 |
| 5,367,282 A | * | 11/1994 | Clem | 338/22 R |
| 5,369,282 A | * | 11/1994 | Arai et al. | 250/492.22 |
| 5,952,155 A | * | 9/1999 | Sakakibara et al. | 430/296 |
| 6,014,200 A | * | 1/2000 | Sogard et al. | 355/53 |
| 6,768,125 B2 | | 7/2004 | Platzgummer et al. | |
| 7,084,411 B2 | * | 8/2006 | Lammer-Pachlinger et al. | 250/492.1 |
| 7,091,504 B2 | * | 8/2006 | Wieland et al. | 250/494.1 |
| 7,276,714 B2 | * | 10/2007 | Platzgummer et al. | 250/492.22 |
| 7,385,197 B2 | * | 6/2008 | Nakasuji et al. | 250/310 |
| 7,423,274 B2 | * | 9/2008 | Nakayama et al. | 250/491.1 |
| 7,453,075 B2 | * | 11/2008 | Kruit | 250/492.22 |
| 2004/0021845 A1 | * | 2/2004 | Kawahara | 355/67 |
| 2008/0042060 A1 | * | 2/2008 | Nakasuji et al. | 250/310 |
| 2008/0237460 A1 | | 10/2008 | Fragner et al. | |
| 2009/0212213 A1 | * | 8/2009 | Nakasuji et al. | 250/310 |
| 2009/0261267 A1 | * | 10/2009 | Wieland et al. | 250/396 R |

OTHER PUBLICATIONS

Berry et al., "Programmable aperture plate for maskless high-throughput nanolithography," J. Vac. Sci. Technol. B 15(6), Nov./Dec. 1997, 2382-2386.

Kaesmaier et al., "Overview of the Ion Projection Lithography European MEDEA and International Program," SPIE Conference on Microlithography, Santa Clara, CA, USA, Feb. 28-Mar. 1, 2000.

* cited by examiner

*Primary Examiner* — Robert Kim
*Assistant Examiner* — Jason McCormack
(74) *Attorney, Agent, or Firm* — RatnerPrestia (57) ABSTRACT

An improved aperture arrangement in a device for defining a pattern on a target, for use in a particle-beam exposure apparatus, by being irradiated with a beam of electrically charged particles and allowing passage of the beam only through a plurality of apertures. The device includes an aperture array having a plurality of apertures of identical shape defining the shape and relative position of beamlets permeating the apertures. A blanking device switches off the passage of selected beamlets permeating the apertures and defined by them. The apertures are arranged on the aperture array according to an arrangement deviating from a regular arrangement by small deviations, adjusting for distortions caused by the particle-beam exposure apparatus, and the size of the apertures of the aperture array differs across the aperture array in order to allow for an adjustment of the current radiated on the target through the apertures and the corresponding openings.

14 Claims, 3 Drawing Sheets

COMPENSATION OF DOSE INHOMOGENEITY AND IMAGE DISTORTION

FIELD OF THE INVENTION

The invention relates to a maskless particle-beam exposure apparatus for forming a pattern on a surface of a substrate or target by means of a beam of energetic electrically charged particles. More in detail, the invention relates to a pattern definition means and an exposure apparatus employing this pattern definition means. In particular, the pattern definition means is a device for defining a pattern in a particle-beam exposure apparatus, which device is adapted to be irradiated with a beam of electrically charged particles and let pass the beam only through a plurality of apertures. It comprises an aperture array means which has a plurality of apertures of defined shape defining the shape and relative position of beamlets permeating said apertures, and further a blanking means to switch off the passage of selected beamlets. This blanking means has a plurality of openings, each opening corresponding to a respective aperture of the aperture array means and being provided with a deflection means controllable to deflect particles radiated through the opening off their path to an absorbing surface within said exposure apparatus.

BACKGROUND

The potential use of an addressable mask for direct pattern transfer by charged particle beam projection has been investigated since the 1980's. Such masks will be advantageous in the field of particle-beam lithography used in semiconductor technology. Therein, lithography apparatus are used to define structures on a target, e.g. a silicon wafer. (Throughout this disclosure, the terms target and substrate are used interchangeably.) In order to define a desired pattern on a substrate wafer, the wafer is covered with a layer of a radiation sensitive photoresist. Afterwards, a desired structure is imaged onto the photoresist by means of a lithography apparatus, and the photoresist is then patterned by partial removal according to the pattern defined by the previous exposure step and then used as a mask for further structuring processes such as etching. In another important application the pattern may be generated by direct patterning without a resist, for example ion milling or reactive ion beam etching or deposition.

In 1997, I. L. Berry et al., in J. Vac. Sci. Technol. B, 15(6), 1997, pp. 2382-2386, presented a writing strategy based on a blanking aperture array and an ion projection system. Arai et al., U.S. Pat. No. 5,369,282, discuss an electron-beam exposure system using a so called blanking aperture array (BAA) which plays the role of a pattern definition means. The BAA carries a number of rows of apertures, and the images of the apertures are scanned over the surface of the substrate in a controlled continuous motion whose direction is perpendicular to the aperture rows. The rows are aligned with respect to each other in an interlacing manner to that the apertures form staggered lines as seen along the scanning direction. Thus, the staggered lines sweep continuous lines on the substrate surface without leaving gaps between them as they move relative to the substrate, thus covering the total area to be exposed on the substrate.

The above-mentioned article of Berry et al. describes a pattern definition device comprising a "programmable aperture array" with an array of 3000×3000 apertures of 5 μm side length with an n=4 alignment of rows and staggered lines. The article proposes to use a 200× demagnification ion-optical system for imaging the apertures of the BAA onto the substrate.

Starting from Berry's concept, E. Platzgummer et al., in the U.S. Pat. No. 6,768,125, presented a multi-beam direct write concept, dubbed PML2 (short for "Projection Maskless Lithography"), employing a pattern definition device comprising a number of plates stacked on top of the other, among them an aperture array means and a blanking means. These separate plates are mounted together at defined distances, for instance in a casing. The aperture array means has a plurality of apertures of identical shape defining the shape of beamlets permeating said apertures, wherein the apertures are arranged within a pattern definition field composed of a plurality of staggered lines of apertures, wherein the apertures are spaced apart within said lines by a first integer multiple of the width of an aperture and are offset between neighboring lines by a fraction of said integer multiple width. The blanking means has a plurality of blanking openings arranged in an arrangement corresponding to the apertures of the aperture array means, in particular having corresponding staggered lines of blanking openings. The teaching of the U.S. Pat. No. 6,768,125 with regard to the architecture and operation of the pattern definition device are hereby included as part of this disclosure by reference.

The main advantage of the PML2 multi-beam direct write concept is the large enhancement of the writing speed compared to single beam writers (multi-beam approach means a charged particle beam consisting of a plurality of sub-beams dynamically structured by an aperture plate including switchable blanker devices). The improved productivity mainly arises from the following features:

The required current density is significantly reduced (relaxed source requirement);

The required single beam blanking rate can be limited to the low MHz-regime;

The importance of space charge is reduced (current is distributed to a large cross section when a broad beam is used);

Enhanced pixel transfer rate due to parallel writing strategy (instead of sequential raster scan);

High degree of redundancy possible using a plurality of beams (usable, for example, for gray scale generation).

However, the PML2 has a number of challenges with respect to multi-beam patterning:

All beams need to have a generally identical dose rate (i.e. number of particles per gray level pixel exposure);

All beams need to have generally identical shape;

All beams need to be positioned on the target on a highly regular grid, which would require a practically distortion-free imaging and full control of current-dependent (=pattern-dependent) image distortion and de-focusing;

The need for a very precise wafer scanning system with sophisticated beam tracking (including correction of image placement, image rotation, image magnification and image distortion errors).

The U.S. Pat. No. 7,276,714 of the applicant/assignee discloses a pattern definition means for particle beam processing, comprising at least an aperture plate and blanking means. The apertures in the aperture plate are arranged in "interlocking grids", i.e., the apertures are arranged in groups in squares or rectangles whose basic grids are meshed together. This means that the positions of the apertures taken with respect to a direction perpendicular to a scanning direction and/or parallel to it are offset to each other by not only multiple integers of the effective width of an aperture taken along said direction, but also by multiple integers of an integer fraction of said effective width. In this context, "scanning direction" denotes the direction along which the image of the apertures formed by the charged-particle beam on a target surface is moved over the target surface during an exposure process.

This leads to a finer resolution on the target surface even though the individual spots formed by each image of an individual aperture are not decreased in size. Particular values of the fractional offsets are integer multiples of $\frac{1}{2}^N$ times the effective width of an aperture, where N is a positive integer.

The state of the art PML2 concept is a strategy where the substrate is moved continuously, and the projected image of a structured beam generates 100 percent of the gray pixels by subsequent exposures of apertures located in line. To realize gray levels, the total amount of apertures in line is subdivided into columns, the number of columns corresponding to the number of desired gray levels. In a recent variant described in US Patent Application Publication No. US-2008/0237460 A1 by the applicant/assignee, a so called "trotting mode" writing strategy is proposed in which for each pixel one or a few beams along the (mechanical) scanning direction are used to generate the entire set of the gray pixels. The advantage of this variant is the reduced complexity of the CMOS structure and improved data management.

In all writing strategies based on a bitmap type of pattern coding, accurate placement control of the individual beams with respect to an ideal grid (physical grid, typically 20 nm pitch) is essential in order to fulfill lithographic requirements. While basically a systematic distortion of the image would cause a non-isotropic change of the blur, in the mentioned "trotting mode" a systematic distortion would also give rise to significant distortion of the pattern eventually generated as here only one beam (or a few, depending on the chosen strategy and redundancy) contribute to the total exposure dose of one pixel. Similarly, the dose per level, which is directly related to the aperture size and current density at the respective position on the aperture plate, becomes more important in the case of the trotting mode.

In the article "Overview of the Ion Projection Lithography European MEDEA and International Program" (SPIE Conference on Microlithography, Santa Clara, USA, Feb. 28-Mar. 1, 2000), R. Kaesmaier and H. Löschner discuss a correction of the pattern position in a stencil mask, introducing a X/Y placement correction such the ion-optical pattern transfer is achieved with virtually zero distortion at the wafer level.

SUMMARY OF THE INVENTION

In view of the above, it is the task of the present invention to find a way to overcome the deficiencies of prior art and allow an improved control of the dose rate (dose per beam per gray level) and relative placement of the beams in the multi beam array in order to form an array of beams which, at its final position on the target, is undistorted and has an identical dose increment per gray level (i.e. for equal "beam on" interval) and practically identical beam shape. In other words, the task of the invention is to allow a very efficient bitmap coding of the writing data stream, which can be done in "real time" using an online data preparation module, based on identical beams distributed on an ideal grid. According to the basic idea of the invention, the relative placement of the beams is accomplished by pre-distortion of the array of apertures in the BAA (pattern definition device), and the dose rate correction is done by adapting the sizes of apertures according to the current density of the illuminating beam.

As has been well established in the state of the art, the dose rate per beam is unavoidably influenced by the local current density generated by the illuminating beam, which is generally a radial function of the distance from the optical axis. The distortion of the image caused by distortion errors of the projection system is as well generally a function of the radial distance (i.e., the distance from a center, usually the distance from the optical axis). Therefore, a leveling of the dose rate and relative position correction (pre-distortion) over the radial distance is highly desirable. Both, current density variation and distortion can be pre-calculated quite accurately using state-of-the-art charged particle optics calculation routines which include space charge and very precise field calculation. Moreover, generally, the distortion of the image caused by distortion errors of the projection system may be a function not only of the radial distance; rather, in particular when particle-optical components that do not have radial symmetry (such as multipole electrodes) the distortion may depend on the azimuthal angle as well.

In other words, the present invention solves the above-mentioned problem starting from a device for defining a pattern on a target, for use in a particle-beam exposure apparatus, which device is adapted to be irradiated with a beam of electrically charged particles and allowing passage of the beam only through a plurality of apertures, and comprises:
- an aperture array means having an aperture array comprising a plurality of apertures defining the shape of beamlets permeating said apertures; and
- a blanking array means for switching off the passage of selected beamlets, said blanking means having a plurality of corresponding openings, each corresponding opening being located in correspondence with a respective aperture of the aperture array and being provided with a controllable deflection means for deflecting particles radiated through the opening off their path, wherein the apertures are arranged in the aperture array means according to an arrangement of apertures, said arrangement defining the size and position of the apertures, and the apertures are meant to be imaged in a particle-beam exposure apparatus onto a target to be exposed. According to the invention, the arrangement is chosen such that it is based on a basic arrangement but has deviations from the basic arrangement: the basic arrangement corresponds to at least one non-overlapping area containing apertures of equal size and shape arranged in a regular translational lattice grid, whereas the deviations from the basic arrangement are configured to compensate inhomogeneities of the current density of the beam across the plurality of apertures and/or imaging distortions in the particle-beam exposure apparatus. The deviations correspond to a quasi-continuous function which varies from one aperture to a neighboring aperture (or one beam to a neighboring beam) by an amount being smaller by at least one order of magnitude than a minimal offset allowed within the regular translational grid.

The present invention allows for an efficient correction of the mentioned beam and imaging defects by means of a suitable adjustment of position and/or size of the apertures in the aperture plate (this means that, preferably, the apertures have the same shape but may have varying size). Thus, the present invention enhances the precise lithographic definition of the image to be produced on the target, and ensures a high resolution of the individual features of the image, independently of the relative position of the beams with respect to the optical axis. Furthermore, the invention allows an efficient bitmap coding of the dose distribution needed to produce the "as designed" structure on the substrate. Bitmap coding is necessary to employ fast algorithms for transforming a designed pattern (for example given as GDSII file) into a data stream that can be handled by the BAA and data path elements. For high throughput applications the BAA has generally a limited number of possible gray levels due to limited space for addressing lines and limited clock speed of the ASIC structure embedded in the aperture membrane.

In practice, the change of the aperture size needed for dose rate correction is small compared with the aperture size itself. Therefore, the change in beam shape and particularly geometric beam size (=spot size or pixel size on substrate) does not have any significant influence on the produced lithographic pattern (or directly patterned structure). The reason for this is that the typical dose distribution generated by one beam has the shape of a 2D error function with a blur in the same range as the width. Therefore, a size variation from area A to A* has only a minor effect on the 50% contour (assuming here the 50% contour as threshold dose where the resist forms the feature edge) if the dose rate j is changed as j*/j=A/A* and the absolute change is small, for example (A*−A)/A<5%. The typical geometric beam size (spot size) for a beam is 20 nm, for which a current density error of the illumination of −4% would be compensated by a width correction of +2%, i.e. to a 20.4 nm geometric spot size. As this example shows, the small change in spot size of 0.4 nm has no significant influence on the position of the feature edge or critical dimension (line width), however, still means a significant dose increase. Also in the case of interlocking grids, as discussed in U.S. Pat. No. 7,276,714 of the applicant/assignee, there is no significant influence on the position of the feature edge or critical dimension by variation in spot size according to the invention.

The positions of the openings in the blanking plate are chosen in correspondence with those of the apertures, usually with a sufficient size so as to allow clear passage of the beamlet even taking into account position deviation and tolerance of the corresponding aperture. In other words, the corresponding openings in the blanking means are arranged in an arrangement of openings; this arrangement may also be based on a basic arrangement but has deviations from the basic arrangement. The arrangement of the apertures of the aperture array may be chosen different to the arrangement of the corresponding openings of the blanking means, for instance to allow for a relaxed variation in the blanking openings as compared to the apertures. This is possible since it is the apertures which define the shape and position of the beamlets, whereas the blanking openings should allow passage to the beam anyway, while the blanking deflectors may introduce a deflection of the individual beamlet according to the desired pattern.

Generally, it is not possible to pre-calculate the optical distortion with arbitrary accuracy, so there will be always a residual error of the aperture arrangement with respect to the ideal arrangement which allows a completely undistorted array of beams in the image (on the substrate).

In one special aspect of the invention, the size of the apertures is configured to vary from a uniform size realizing deviations of the arrangement configured to compensate for deviations of the current density of the beam permeating the apertures from a given set value, so as to allow the same current to be radiated through every aperture on the target. Typical maximum values of the correction amount to a few percent of the aperture side length, e.g. 2%.

In another special aspect the position of the apertures is configured to vary from a regular basic arrangement realizing deviations of the arrangement configured to compensate for imaging distortions measured beforehand for an imaging system of a specific particle-beam exposure apparatus.

The aperture array may be positioned in front of or after the blanking means as seen in the direction of the particle beam.

For defining an arrangement of apertures according to which positions of apertures are defined for a device for defining a pattern on a target as described above, the following method could be used according to the invention: First, define at least one area containing apertures on the aperture array means (and possibly on the blanking array means); then define in each area a basic arrangement containing apertures of equal size and shape arranged in a regular translational lattice grid; define for each basic arrangement additional deviations which correspond to a quasi-continuous function which varies from one aperture to a neighboring aperture by an amount being smaller by at least one order of magnitude than a minimal offset allowed within the regular translational grid, ensuring that said deviations from the basic arrangement are configured to compensate at least one of inhomogeneities of the current density of the beam across the plurality of apertures and imaging distortions in the particle-beam exposure apparatus.

A further development of the present invention implements a two-step correction, comprising two correction aspects which in the following are referred to as coarse correction and fine correction, respectively: By means of the coarse correction the major distortion of the projection optics is corrected by using a PD device having a pre-distorted arrangement of the aperture array, including the aperture arrays in the aperture plate and the blanking plate (including the CMOS circuit, major distortion error up to 100-200 nm in the image). The pre-distortion is chosen such that it compensates the imaging deviations of the projections system as known beforehand, and thus will correct for a major amount of imaging distortions. A fine correction step is then added in order to adjust the fine placement and size variation of the apertures in the aperture plate in order to compensate for variations in illumination intensity (few percent) and residual distortion errors (few nanometers).

In correspondence with the mentioned further development, the method for defining the arrangement of apertures could be first realized in the aperture array means of the pattern-defining device and, possibly, a corresponding arrangement is realized in the blanking array means ('coarse correction'). Then, in a particle-beam exposure apparatus in which the pattern-defining device is implemented, the image of the aperture array as formed within said apparatus is measured. The image thus measured is compared with a desired set-value image, in order to determine residual deviations incorporating at least one of residual inhomogeneities of the current density of the beam across the plurality of apertures and residual imaging distortions in the particle-beam exposure apparatus, and determine second additional deviations which are configured to compensate said residual deviations. The arrangement of apertures in the aperture array means is then adjusted according to the second additional deviations ('fine correction').

Typical maximal values expected for the correction according to the invention are up to 100 to 200 nm in the image on the target for the coarse correction, corresponding to about 20-40 μm in the pattern definition field; the fine correction will be of the order of (additional) up to 1 to 2 nm in the image, corresponding to 0.2-0.4 μm in the aperture plate.

BRIEF DESCRIPTION OF THE DRAWINGS

In the following, the present invention is described in more detail with reference to the drawings, which show:

FIG. 1 in a longitudinal section a layout of a lithography apparatus to which the invention applies, FIG. 2 the pattern definition device of the lithography apparatus of FIG. 1 in a longitudinal section, FIG. 3 a plan view of an aperture plate with regularly placed apertures, FIG. 4 the plan view an aperture plate wherein the apertures are adjusted in size, FIG. 5 a plan view of an aperture plate with apertures which are shifted in two dimensions, FIG. 6 a plan view of an aperture plate wherein the apertures are shifted in position and adjusted in size, FIG. 7 a detail of FIG. 6 illustrating the positioning the apertures, FIG. 8 the longitudinal section of a pattern definition device according to prior art, FIG. 9 a longitudinal section of a pattern definition device according to the invention, with a coarse correction applied, and FIG. 10 the pattern definition device of FIG. 9 with a fine correction applied.

DETAILED DESCRIPTION OF THE INVENTION

It should be appreciated that the invention is not restricted to the embodiments discussed in the following, which merely represent possible implementations of the invention.

Figure 1:
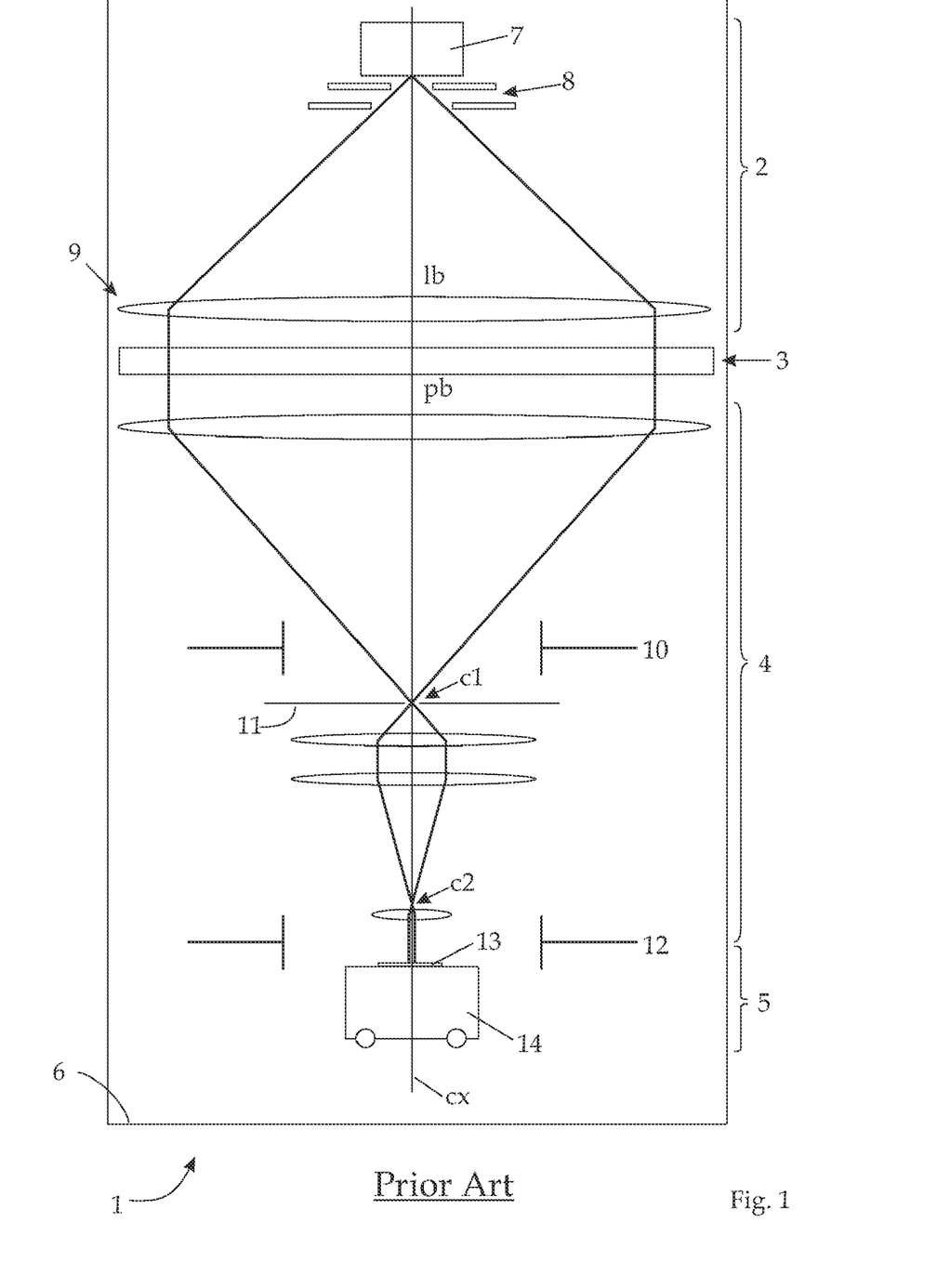

An overview of a lithographic apparatus employing the preferred embodiment of the invention is shown in FIG. 1. Such a lithographic apparatus is well known in prior art. In the following, only those details are given as needed to disclose the invention; for the sake of clarity, the components are not shown to size in FIG. 1. The main components of the lithography apparatus 1 are—corresponding to the direction of the lithography beam lb, pb which in this example runs vertically downward in FIG. 1—an illumination system 2, a pattern definition (PD) system 3, a projecting system 4, and a target station 5 with the substrate 13. The whole apparatus 1 is contained in a vacuum housing 6 held at high vacuum to ensure an unimpeded propagation of the beam lb, pb along the optical axis cx of the apparatus. The particle optical systems 2, 4 are realized using electrostatic or electromagnetic lenses.

The illumination system 2 comprises, for instance, an electron gun 7, an extraction system 8 as well as a condenser lens system 9. It should, however, be noted that in place of electrons, in general, other electrically charged particles can be used as well. Apart from electrons these can be, for instance, hydrogen ions or heavier ions, charged atom clusters, or charged molecules.

The extraction system 8 accelerates the particles to a defined energy of typically several keV, e.g. 10 keV. By means of a condenser lens system 9, the particles emitted from the source 11 are formed into a wide, substantially telecentric particle beam serving as lithography beam lb. The lithography beam lb then irradiates a PD system 3 which comprises a number of plates with a plurality of openings and/or apertures. The PD system 3 is held at a specific position in the path of the lithography beam lb, which thus irradiates the plurality of apertures and/or openings and is split up into a number of beamlets.

Some of the apertures and/or openings are "switched on" or "open" so as to be transparent to the incident beam in the sense that they allow the portion of the beam (beamlet) that is transmitted through it to reach the target; the other apertures and/or openings are "switched off" or "closed", i.e. the corresponding beamlets cannot reach the target, and thus effectively these apertures and/or openings are non-transparent (opaque) to the beam. Thus, the lithography beam lb is structured into a patterned beam pb, emerging from the PD system 3. The pattern of switched on apertures and/or openings—the only portions of the PD system 3 which are transparent to the lithography beam lb—is chosen according to the pattern to be exposed on the substrate 13. It has to be noted that the "switching on/off" of the beamlets usually is realized by some sort of blanking means provided in one of the plates of the PD system 3: "Switched off"-beamlets are deflected off their path (by very small angles) so they cannot reach the target but are merely absorbed somewhere in the lithography apparatus, e.g. by an absorbing plate 11.

The pattern as represented by the patterned beam pb is then projected by means of an electro-magneto-optical projection system 4 onto the substrate 13 where it forms an image of the "switched-on" apertures and/or openings. The projection system 4 implements a demagnification of, for instance, 200× with two crossovers c1 and c2. The substrate 13 is, for instance, a silicon wafer covered with a photo-resist layer. The wafer is held and positioned by a wafer stage 14 of the target station 5.

In the embodiment shown in FIG. 1, the projection system 4 is composed of a number of consecutive electro-magneto-optical projector stages, consisting of electrostatic or electromagnetic lenses and other deflection means. These lenses and means are shown in symbolic form only, since their application is well known in the prior art. The projection system 4 employs a demagnifying imaging through crossovers c1, c2. The demagnification factor for both stages is chosen such that an overall demagnification of several hundred results, e.g. 200×. A demagnification of this order is in particular suitable with a lithography setup, in order to alleviate problems of miniaturization in the PD device.

In the whole projection system 4, provisions are made to extensively compensate the lenses and or deflection means with respect to chromatic and geometric aberrations. As a means to shift the image laterally as a whole, i.e. along a direction perpendicular to the optical axis cx, deflection means 10 and 12 are provided in the projection system 4. The deflection means can be realized as, for instance, a multipole electrode system which is either positioned near the crossover, as shown in FIG. 1 with the first deflection means 10, or after the final lens of the respective projector, as in the case with the second stage deflection means 12 in FIG. 1. In this apparatus, a multipole electrode is used as deflection means both for shifting the image in relation to the stage motion and for correction of the imaging system in conjunction with the alignment system. These deflection means 10, 12 are not to be confused with the deflection array means of the PD system 3 which are used to switch selected beamlets of the patterned beam pd "on" or "off", since the former only deal with the particle beam as a whole.

Figure 2:
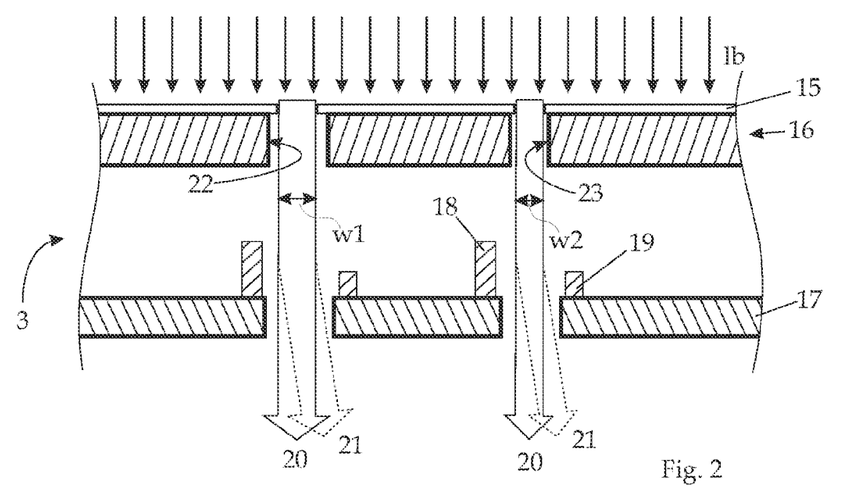

FIG. 2 depicts a sectional detail of the PD system 3 in more detail. It shows a lithography beam lb that is structured into a patterned beam; however, for the sake of simplicity, instead of a multitude of beams only two transgressing beamlets 20 are depicted here. Regarding the possible case that a beamlet is deflected off its path, the deflected beams 21 are shown with dotted lines.

The PD system 3 of FIG. 2 comprises an aperture plate 16 and a blanking plate 17, arranged consecutively as seen in the direction of the incident beam lb. This arrangement is only one of many different embodiments of a PD system and is not intended to restrict the scope of the invention.

The aperture plate 16 has an optional protecting layer 15, protecting the plate against the impinging energetic particles, and two apertures 22, 23. Naturally, such an aperture plate 16 usually has a plurality of apertures, but only these two apertures are depicted here for the case of simplicity.

The blanking plate 17 as well has a number of openings, which correspond to the apertures of the aperture plate 16. Each opening is provided with a set of blanking means to affect the transgressing beamlet: In the case depicted in FIG. 2, these blanking means are a pair of electrodes, namely a ground electrode 18 and a deflection electrode 19. By energizing these electrodes 18, 19, the opening can be "switched off", thus, the beamlet is deflected (path denoted by dashed arrow 21) and does not reach the target consequently. When the electrodes are not energized, the openings are "switched on" and the beamlets are not deflected off their path (arrow 20). Energizing is done by applying a voltage between the electrodes 18, 19, a voltage which is sufficiently different from the default voltage in the non-energized state; usually, the default voltage is zero, i.e., the electrodes are at the same electric potential (within a tolerance that is small compared to the energizing voltage). The energizing voltage may typically be in the range of a few Volts.

Figure 4:
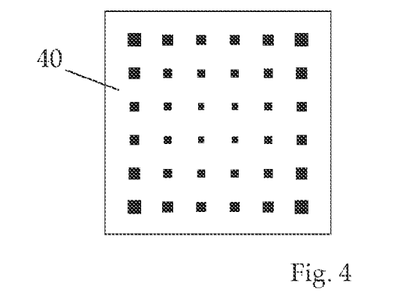
Figure 5:
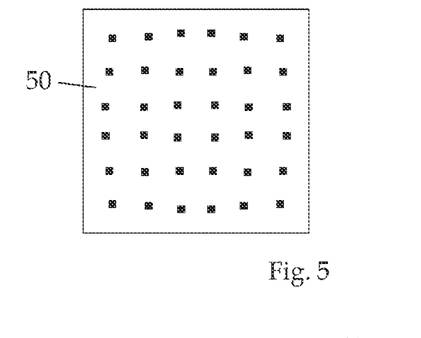

According to prior art the widths w1, w2 of the apertures of the aperture plate 16, which define the width of the transgressing beams, are basically identical. However, it has been shown that the dose rate transmitted to the target varies heavily, mainly as a function of the distance from the optical axis cx. A beamlet located near to the optical axis cx will usually transmit a different (higher or lower) dose than a beamlet at the periphery, depending on the higher order changes of the transmission function and the angular brightness homogeneity of the illumination source. Further, despite the compensation provisions mentioned above, the electro-optical components of the lithography apparatus will introduce residual chromatic and optical aberrations into the lithographic beam lb. To take account for the multitude of irregularities, different approaches may be applied to solve said problems. Two basic approaches are depicted in FIGS. 4 and 5, and explained in more detail in the following figures: The widths w1, w2 of the apertures may differ depending on the location on the aperture plate, furthermore, the apertures are located not following a regular grid, but with small deviations configured to compensate for imaging defects.

Figure 3:
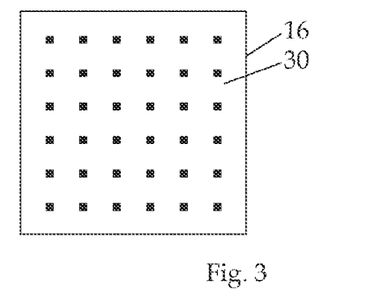

FIG. 3 shows a plan view of an exemplary aperture plate 16 which, for the sake of simplicity, is shown having an aperture field 30 of only 36 apertures, arranged regularly in a square; it will be clear that an aperture plate for realistic use in a lithography apparatus will have much more apertures (typically 256*256 or 512*512). The arrangement of the apertures in the aperture field corresponds to a regular grid of regular shapes, in this case squares, in which some of the shapes are chosen as positions for the apertures. Thus, in the case shown in FIG. 3, the place between neighboring apertures is that of several grid places, which in this case is equivalent to several neighboring squares. The depictions of the basic arrangement of the apertures in FIGS. 3 to 6 is simplified in order to more clearly demonstrate the invention; the basic arrangement shown is that of a straight regular array, suppressing the staggered-lines arrangement as shown in U.S. Pat. No. 6,768, 125 and U.S. Pat. No. 7,276,714. In order to recover the staggered lines grid of U.S. Pat. No. 6,768,125 or U.S. Pat. No. 7,276,714, a regular grid as shown is complemented by interpolating in the space in between the horizontal lines and vertical columns additional lines and columns according to a staggered arrangement in a suitable way.

It is worthwhile to note that the grid may allow offsets between apertures which are a fraction, such as $½^N$, of a grid length, as discussed in U.S. Pat. No. 7,276,714. Also, the overall aperture field may be divided into non-overlapping areas wherein the arrangement grids are offset to each other, as also discussed in U.S. Pat. No. 7,276,714. The simplest case, on the other hand, is a basic square grid, wherein the minimal offset is equal to one side of a square, and each aperture occupies one square of the grid. In all of these cases, the present invention may be realized, and is distinct over the offsets used there in that the deviations of the aperture size/position can take values that are not compatible with such a regular grid, and usually are much smaller than the smallest offset that is allowed in the respective grid or between adjacent grids.

FIG. 4 illustrates an approach according to the invention for solving the problem of varying local current density as a function of the radial distance. In this exemplary aperture field 40, the farther away the apertures are located from the center of the plate, the larger is their width. This compensates for a current density slowly decreasing from a center value when going outwards with increasing radial distance. One example of possible aperture sizes would be 8 μm with a correction slowly increasing to up to ±0.1 μm. This corresponds to ±2.5 percent dose rate variation over the field.

FIG. 5 shows another plate in which the aperture positions are adjusted to compensate for optical distortions. The position of each aperture is slightly shifted off the position of the basic grid. Overall, the basic grid is still discernible, but also the small deviations from the basic grid (which are depicted exaggerated in the figures) are clearly visible. Generally, the overall field 50 will realize a "barrel-like" distortion in order to compensate a "pillow-shape" distortion in the image projection system.

It will be clear from FIGS. 4 and 5 that the variation of the aperture size/position varies only slightly from one aperture to the next, but over the whole aperture field the deviation from the basic grid (represented by the positions in the aperture field 30 of FIG. 3) may sum up to a considerable amount of the size/position difference with regard to a standard value.

It should be clear that the approach illustrated in FIG. 4 allows for an adjustment of the dose rate, creating spots of slightly different sizes on the substrate, but does not influence the optical distortions (i.e. center position of beams on substrate). Conversely, the approach of FIG. 5 is directed at compensating optical distortions without affecting the current density, i.e., the dose current per beamlet, as a function of the radial distance.

Figure 6:
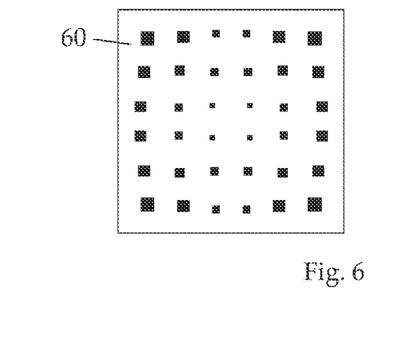
Figure 7:
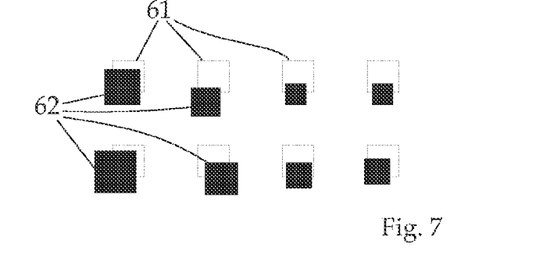

In a further development, the two mentioned compensation approaches can be combined into one arrangement, as illustrated by the apertures arrangement 60 of FIG. 6. A sectional view of some apertures like the one depicted in FIG. 6 is shown in FIG. 7: A regular grid 61 is dotted, denoting the basic position of apertures; in prior-art, the apertures were designed to be located at right these positions (not taking into account possible fabrication deviations). For comparison, the shifted and size-adjusted apertures 62 are shown filled. It will be clear from this figure that the apertures are adjusted with regard to their positions according to a function that varies slowly from one aperture to the next one.

The adjustment according to the invention serves to correct for failures introduced into the system by the electro-optical systems and other irregularities which have a smooth continuous dependence upon the position across the area of the lithography beam, typically upon the radial distance (a circumferential dependence is usually negligible and could be corrected by appropriate means such as a multiple electrode). With regard to the individual beamlets, this continuous dependence will reflect as a quasi-continuous behavior of the deviation of position (or beamlet current) as function of the radial distance, which consequently will vary only slowly between neighboring beamlets. Therefore, the correction introduced into the position/size of the apertures according to the invention will be a like quasi-continuous function of the radial distance which function may locally take notable values, but the variation between neighboring apertures will be small. The term "neighboring apertures" here refers to apertures which are geometrical nearest neighbors, i.e. for each aperture the neighboring apertures are the surrounding apertures with the smallest distance to the aperture in question.

It is worthwhile to note that the application of the solution according to the invention is not confined to the correction of distortions depending on the radial distance. Size and position of the apertures can be adapted to compensate for distortions of any symmetry, e.g. distortions caused by a particle source with shifted center of intensity, high-order optical components (such as multiple electrodes) and the like.

Figure 8:
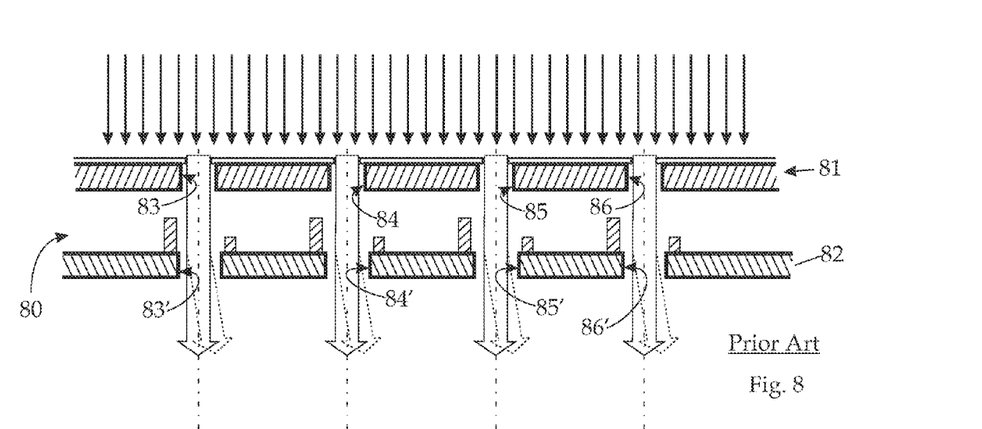
Figure 9:
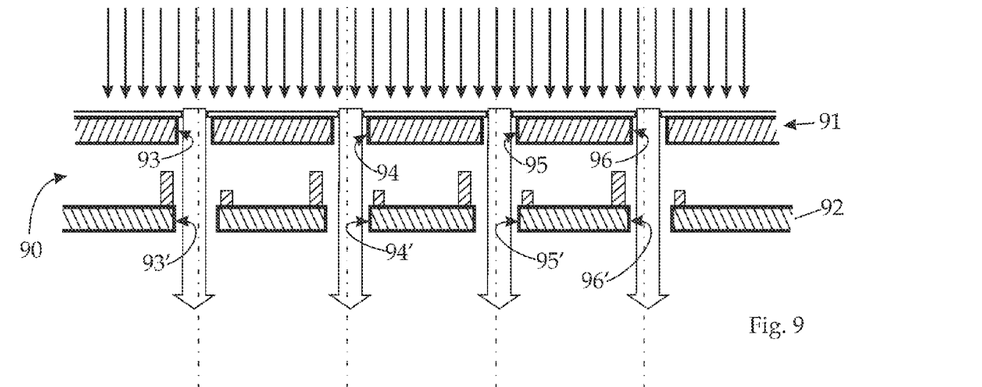
Figure 10:
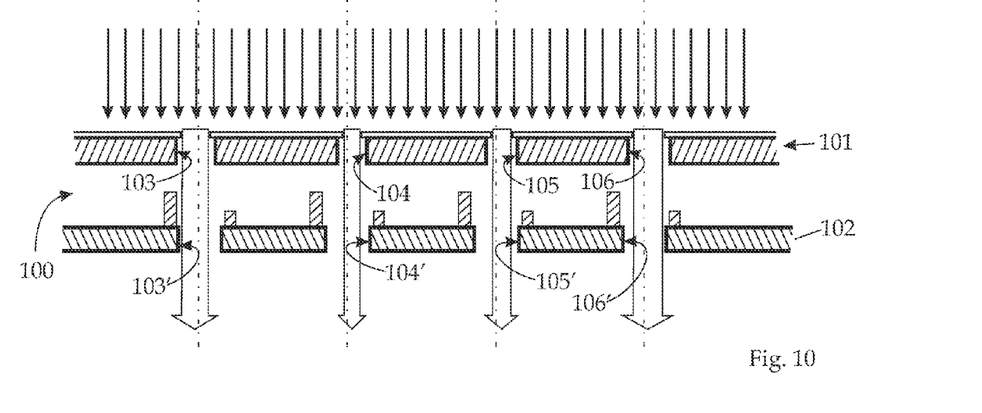

A further development of the present invention implements a two-step correction, with a coarse correction and fine correction. This two-step correction is depicted in FIGS. 9 and 10, which show a longitudinal section of a pattern definition device 80, 90, 100. The extent of the corrections are exaggerated in FIGS. 9 and 10 so to be better visible. FIG. 8, for the purpose of comparison, shows a pattern definition device 80 according to prior art. For the sake of simplicity, the pattern definition devices in FIGS. 8-10 show only four aperture-opening pairs instead of a multitude of such pairs. The pattern definition device 80 of FIG. 8 comprises an aperture plate 81 and a blanking plate 82 with a set of apertures 83, 84, 85, 86 and corresponding openings 83', 84', 85', 86'. All apertures 83, 84, 85, 86 in the aperture plate 81 have the same width and are congruent with the subsequent openings 83', 84', 85', 86' of the blanking plate 82. For the sake of completeness it is mentioned here that, again, this setup with an aperture plate 81 being followed by a blanking plate 82 (as seen in the direction of the particle beam) is only one exemplary sequence.

The correction according to the invention comprises the following steps: First, a coarse correction (FIG. 9) will be introduced into the apertures in the aperture plate 91 and equivalently in the blanking plate 92, in order to correct the major distortion of the projection optics. This is done by providing for a pre-distorted arrangement of apertures 93, 94, 95, 96 in the aperture plate 91. The openings 93', 94', 95', 96' may be distorted as well, as is the case for openings 93' and 96'. In order to be able to compare the apertures/openings in FIGS. 8-10, dot-and-dash lines are provided for each aperture-opening-pair, signifying the centre of apertures and respective openings in undistorted arrangements according to prior art. In order to optimize the telecentricity of the beam at the location of the image one usually has to accept quite a large distortion error which may be 200 nm at the edge of a 80 µm large image field. For this, it may be suitable or even obligatory to provide for adaptation in the CMOS circuit, to allow for displacement of up to 100-200 nm in the image. The pre-distortion is chosen such that it compensates the imaging deviations of the projections system, which can be determined beforehand. This will correct the imaging distortions to great extent, but in general, a residual distortion will remain (The required position precision of a position error less than 2 nm is in the range of predictability using state-of-the-art calculation tools). A fine correction step based on metrology of reference exposures is then added in order to compensate those residual distortions.

The fine adjustment (FIG. 10) is done by measuring the residual errors in dose rate and beam placement with respect to the ideal grid using reference exposures, which could not be compensated by the coarse correction, and this fine correction data are incorporated in the aperture plate. This fine adjustment usually results in variations of the size and/or the fine placement of the apertures 103, 104, 105, 106 in the aperture plate 101. The blanking plate 102 with its openings 103', 104', 105', 106' is unmodified. For the sake of simplicity, only variations in size are depicted in FIG. 10. As can be seen, the width of two apertures, 103 and 106, is increased, whereas the width of two apertures, 104 and 105, is decreased.

In the general case, it might be necessary to fabricate a new aperture plate 101 using a suitable lithography process to define the shape and position of the slightly changed apertures, incorporating the necessary corrections, to compensate for illumination intensity and residual distortion errors. In some cases, it will be possible to apply e.g. a focused ion or electron or laser beam modification similar as in photo mask repair tools, or any other technology which allows local modification, to increase or decrease the width of an aperture or a group of apertures.

The fine correction will be facilitated by using multi-pole beam correction applying higher order electromagnetic fields to control the shape and size of the beam array as a whole. The advantage of this method is that tool-dependent errors (alignment of lenses, constant stray fields, etc.) can be compensated by adapting the rather simple aperture plate geometry (size and position of apertures on this plate), while the coarse correction and thus the geometry of the blanking plate may be equal for all tools within a tool generation and relates only to the design of the optical system.

The correction illustrated in FIG. 5 is then used with the coarse correction. The aperture positions differ from the ideal grid with up to ±40 µm, which corresponds to up to ±200 nm image field distortion correction. The coarse correction may also be done to the positions of the openings in the blanking plate; since the incremental displacements are small, this can be done easily by adjusting the components by the required small amounts of displacement. In this example, the coarse correction only deals with the image distortion, but does not affect possible dose rate inhomogeneity; of course, it could be possible to take this into account as well, if systematic source inhomogeneity is known beforehand.

The PD device with FIG. 6 shows a plate with a fine correction: Additionally to the shifted apertures, the size of the apertures is adjusted as well to compensate for optical distortions and dose inhomogeneity. This now allows to create identical spots with the same transferred dose all over the substrate wafer. Even though the apertures are arranged in rather random order, the resulting images of the apertures on the substrate wafer are in a regular order and are all illuminated by the same dose.

Even though it is a first goal of the invention to have every aperture deliver the same dose, i.e. number of particles, to its image position on the substrate wafer, it is also possible to use the invention to provide each image position with a certain dose by adjusting size and position of the aperture accordingly. This can be used to provide the images of the peripheral apertures with half the dose of the central apertures, for instance.

While preferred embodiments of the invention have been shown and described herein, it will be understood that such embodiments are provided by way of example only. Numerous variations, changes and substitutions will occur to those skilled in the art without departing from the spirit of the invention. Accordingly, it is intended that the appended claims cover all such variations as fall within the spirit and scope of the invention.

We claim:

1. A device for defining a pattern on a target, for use in a particle-beam exposure apparatus, said device being adapted to be irradiated with a beam of electrically charged particles and allowing passage of the beam only through a plurality of apertures, said device comprising:

an aperture array means having an aperture array comprising a plurality of apertures defining a shape and relative position of beamlets permeating said apertures; and a blanking array means for switching off the passage of selected beamlets, said blanking array means having a plurality of corresponding openings, each corresponding opening being located in correspondence with a respective aperture of the aperture array and being provided with a controllable deflection means for deflecting particles radiated through the opening off their path, wherein the apertures are arranged in the aperture array means according to an arrangement of apertures, said arrangement defining a size and position of the apertures, wherein the arrangement is based on a basic arrangement but has deviations from the basic arrangement, said basic arrangement corresponding to at least one non-overlapping area containing apertures of equal size and shape arranged in a regular translational lattice grid, said deviations from the basic arrangement being configured to compensate at least one of inhomogeneities of the current density of the beam across the plurality of apertures and imaging distortions in the particle-beam exposure apparatus, and wherein said deviations correspond to a quasi-continuous function which varies from one aperture to a neighboring aperture by an amount being smaller by at least one order of magnitude than a minimal offset allowed within the regular translational grid, at least one of i) a deviated position of each of the apertures is based on a radial distance from a central portion of the aperture array and ii) a size of each of the apertures is based on a radial distance from a central portion of the aperture array.

2. The device of claim 1, wherein the corresponding openings in the blanking array means are arranged in an arrangement of openings, which is based on the basic arrangement but has deviations from the basic arrangement, wherein the arrangement of the apertures of the aperture array is different to the arrangement of the corresponding openings of the blanking means.

3. The device of claim 1, wherein the size of the apertures is configured to vary from a uniform size realizing deviations of the arrangement configured to compensate for deviations of the current density of the beam permeating the apertures from a given set value.

4. The device of claim 1, wherein the position of the apertures is configured to vary from a regular basic arrangement realizing deviations of the arrangement configured to compensate for imaging distortions measured beforehand for an imaging system of a specific particle-beam exposure apparatus.

5. The device of claim 1, wherein the aperture array means is positioned after the blanking array means as seen in the direction of the particle beam.

6. The device of claim 1, wherein the aperture array means is positioned in front of the blanking array means as seen in the direction of the particle beam.

7. A particle-beam exposure apparatus for irradiating a target by means of a beam of energetic electrically charged particles, comprising an illumination system for generating and forming said energetic particles into an illuminating beam which is substantially telecentric, a pattern definition device, located after the illumination system as seen along the direction of the beam, said pattern definition device comprising:

an aperture array means having an aperture array comprising a plurality of apertures defining a shape and relative position of beamlets permeating said apertures; and a blanking array means for switching off the passage of selected beamlets, said blanking array means having a plurality of corresponding openings, each corresponding opening being located in correspondence with a respective aperture of the aperture array and being provided with a controllable deflection means for deflecting particles radiated through the opening off their path, wherein the apertures are arranged in the aperture array means according to an arrangement of apertures, said arrangement defining a size and position of the apertures, wherein the arrangement is based on a basic arrangement but has deviations from the basic arrangement, said basic arrangement corresponding to at least one non-overlapping area containing apertures of equal size and shape arranged in a regular translational lattice grid, said deviations from the basic arrangement being configured to compensate at least one of inhomogeneities of the current density of the beam across the plurality of apertures and imaging distortions in the particle-beam exposure apparatus, and wherein said deviations correspond to a quasi-continuous function which varies from one aperture to a neighboring aperture by an amount being smaller by at least one order of magnitude than a minimal offset allowed within the regular translational grid, at least one of i) a deviated position of each of the apertures is based on a radial distance from a central portion of the aperture array and ii) a size of each of the apertures is based on a radial distance from a central portion of the aperture array; and a projection system positioned after the pattern definition device and adapted to project the patterned beam onto a target to be positioned after the projection system.

8. A method for defining an arrangement of apertures according to which, in a device for defining a pattern on a target according to claim 1, positions of apertures are defined, the method comprising:

defining at least one area containing apertures;

defining in each area a basic arrangement containing apertures of equal size and shape arranged in a regular translational lattice grid; and defining for each basic arrangement additional deviations which correspond to a quasi-continuous function which varies from one aperture to a neighboring aperture by an amount being smaller by at least one order of magnitude than a minimal offset allowed within the regular translational grid, wherein said deviations from the basic arrangement are configured to compensate at least one of inhomogeneities of the current density of the beam across the plurality of apertures and imaging distortions in the particle-beam exposure apparatus.

9. The method of claim 8, wherein the arrangement of apertures is realized in the aperture array means of the pattern-defining device and a corresponding arrangement is realized in the blanking array means, the method further comprising:

measuring, in a particle-beam exposure apparatus in which the pattern-defining device is implemented, the image of the aperture array as formed within said apparatus;

comparing the image thus measured with a desired set-value image;

determining residual deviations incorporating at least one of residual inhomogeneities of the current density of the beam across the plurality of apertures and residual imaging distortions in the particle-beam exposure apparatus;

determining second additional deviations which are configured to compensate said residual deviations; and adjusting the arrangement of apertures in the aperture array means according to the second additional deviations.

10. A particle-beam exposure apparatus for irradiating a target by means of a beam of energetic electrically charged particles, comprising an illumination system for generating and forming said energetic particles into an illuminating beam which is substantially telecentric, a pattern definition device, located after the illumination system as seen along the direction of the beam, said pattern definition device comprising:

an aperture array means having an aperture array comprising a plurality of apertures defining a shape and relative position of beamlets permeating said apertures; and a blanking array means for switching off the passage of selected beamlets, said blanking array means having a plurality of corresponding openings, each corresponding opening being located in correspondence with a respective aperture of the aperture array and being provided with a controllable deflection means for deflecting particles radiated through the opening off their path, wherein the apertures are arranged in the aperture array means according to an arrangement of apertures, said arrangement defining a size and position of the apertures, wherein the arrangement is based on a basic arrangement but has deviations from the basic arrangement, said basic arrangement corresponding to at least one non-overlapping area containing apertures of equal size and shape arranged in a regular translational lattice grid, said deviations from the basic arrangement being configured to compensate at least one of inhomogeneities of the current density of the beam across the plurality of apertures and imaging distortions in the particle-beam exposure apparatus, and wherein said deviations correspond to a quasi-continuous function which varies from one aperture to a neighboring aperture by an amount being smaller by at least one order of magnitude than a minimal offset allowed within the regular translational grid, at least one of i) a deviated position of each of the apertures is based on a radial distance from a central portion of the aperture array and ii) a size of each of the apertures is based on a radial distance from a central portion of the aperture array; and a projection system positioned after the pattern definition device and adapted to project the patterned beam onto a target to be positioned after the projection system.

11. A particle-beam exposure apparatus for irradiating a target by means of a beam of energetic electrically charged particles, comprising an illumination system for generating and forming said energetic particles into an illuminating beam which is substantially telecentric, a pattern definition device, located after the illumination system as seen along the direction of the beam, said pattern definition device comprising:

an aperture array means having an aperture array comprising a plurality of apertures defining a shape and relative position of beamlets permeating said apertures; and a blanking array means for switching off the passage of selected beamlets, said blanking array means having a plurality of corresponding openings, each corresponding opening being located in correspondence with a respective aperture of the aperture array and being provided with a controllable deflection means for deflecting particles radiated through the opening off their path, wherein the apertures are arranged in the aperture array means according to an arrangement of apertures, said arrangement defining a size and position of the apertures, wherein the arrangement is based on a basic arrangement but has deviations from the basic arrangement, said basic arrangement corresponding to at least one non-overlapping area containing apertures of equal size and shape arranged in a regular translational lattice grid, said deviations from the basic arrangement being configured to compensate at least one of inhomogeneities of the current density of the beam across the plurality of apertures and imaging distortions in the particle-beam exposure apparatus, and wherein said deviations correspond to a quasi-continuous function which varies from one aperture to a neighboring aperture by an amount being smaller by at least one order of magnitude than a minimal offset allowed within the regular translational grid, at least one of i) a deviated position of each of the apertures is based on a radial distance from a central portion of the aperture array and ii) a size of each of the apertures is based on a radial distance from a central portion of the aperture array; and a projection system positioned after the pattern definition device and adapted to project the patterned beam onto a target to be positioned after the projection system.

12. A particle-beam exposure apparatus for irradiating a target by means of a beam of energetic electrically charged particles, comprising an illumination system for generating and forming said energetic particles into an illuminating beam which is substantially telecentric, a pattern definition device, located after the illumination system as seen along the direction of the beam, said pattern definition device realized as a device comprising:

an aperture array means having an aperture array comprising a plurality of apertures defining a shape and relative position of beamlets permeating said apertures; and a blanking array means for switching off the passage of selected beamlets, said blanking array means having a plurality of corresponding openings, each corresponding opening being located in correspondence with a respective aperture of the aperture array and being provided with a controllable deflection means for deflecting particles radiated through the opening off their path, wherein the apertures are arranged in the aperture array means according to an arrangement of apertures, said arrangement defining a size and position of the apertures, wherein the arrangement is based on a basic arrangement but has deviations from the basic arrangement, said basic arrangement corresponding to at least one non-overlapping area containing apertures of equal size and shape arranged in a regular translational lattice grid, said deviations from the basic arrangement being configured to compensate at least one of inhomogeneities of the current density of the beam across the plurality of apertures and imaging distortions in the particle-beam exposure apparatus, and wherein said deviations correspond to a quasi-continuous function which varies from one aperture to a neighboring aperture by an amount being smaller by at least one order of magnitude than a minimal offset allowed within the regular translational grid, at least one of i) a deviated position of each of the apertures is based on a radial distance from a central portion of the aperture array and ii) a size of each of the apertures is based on a radial distance from a central portion of the aperture array; and a projection system positioned after the pattern definition device and adapted to project the patterned beam onto a target to be positioned after the projection system.

13. A particle-beam exposure apparatus for irradiating a target by means of a beam of energetic electrically charged particles, comprising an illumination system for generating and forming said energetic particles into an illuminating beam which is substantially telecentric, a pattern definition device, located after the illumination system as seen along the direction of the beam, said pattern definition device realized as a device comprising:

an aperture array means having an aperture array comprising a plurality of apertures defining a shape and relative position of beamlets permeating said apertures; and a blanking array means for switching off the passage of selected beamlets, said blanking array means having a plurality of corresponding openings, each corresponding opening being located in correspondence with a respective aperture of the aperture array and being provided with a controllable deflection means for deflecting particles radiated through the opening off their path, wherein the apertures are arranged in the aperture array means according to an arrangement of apertures, said arrangement defining a size and position of the apertures, wherein the arrangement is based on a basic arrangement but has deviations from the basic arrangement, said basic arrangement corresponding to at least one non-overlapping area containing apertures of equal size and shape arranged in a regular translational lattice grid, said deviations from the basic arrangement being configured to compensate at least one of inhomogeneities of the current density of the beam across the plurality of apertures and imaging distortions in the particle-beam exposure apparatus, and wherein said deviations correspond to a quasi-continuous function which varies from one aperture to a neighboring aperture by an amount being smaller by at least one order of magnitude than a minimal offset allowed within the regular translational grid, at least one of i) a deviated position of each of the apertures is based on a radial distance from a central portion of the aperture array and ii) a size of each of the apertures is based on a radial distance from a central portion of the aperture array; and a projection system positioned after the pattern definition device and adapted to project the patterned beam onto a target to be positioned after the projection system.

14. A particle-beam exposure apparatus for irradiating a target by means of a beam of energetic electrically charged particles, comprising an illumination system for generating and forming said energetic particles into an illuminating beam which is substantially telecentric, a pattern definition device, located after the illumination system as seen along the direction of the beam, said pattern definition device comprising:

an aperture array means having an aperture array comprising a plurality of apertures defining a shape and relative position of beamlets permeating said apertures; and a blanking array means for switching off the passage of selected beamlets, said blanking array means having a plurality of corresponding openings, each corresponding opening being located in correspondence with a respective aperture of the aperture array and being provided with a controllable deflection means for deflecting particles radiated through the opening off their path, wherein the apertures are arranged in the aperture array means according to an arrangement of apertures, said arrangement defining a size and position of the apertures, wherein the arrangement is based on a basic arrangement but has deviations from the basic arrangement, said basic arrangement corresponding to at least one non-overlapping area containing apertures of equal size and shape arranged in a regular translational lattice grid, said deviations from the basic arrangement being configured to compensate at least one of inhomogeneities of the current density of the beam across the plurality of apertures and imaging distortions in the particle-beam exposure apparatus, and wherein said deviations correspond to a quasi-continuous function which varies from one aperture to a neighboring aperture by an amount being smaller by at least one order of magnitude than a minimal offset allowed within the regular translational grid, at least one of i) a deviated position of each of the apertures is based on a radial distance from a central portion of the aperture array and ii) a size of each of the apertures is based on a radial distance from a central portion of the aperture array; and a projection system positioned after the pattern definition device and adapted to project the patterned beam onto a target to be positioned after the projection system.

* * * * *